(12) United States Patent
Zheng et al.

(10) Patent No.: US 8,772,162 B2
(45) Date of Patent: *Jul. 8, 2014

(54) METHOD FOR REMOVING NATIVE OXIDE AND ASSOCIATED RESIDUE FROM A SUBSTRATE

(71) Applicants: Bo Zheng, Saratoga, CA (US); Arvind Sundarrajan, San Jose, CA (US); Xinyu Fu, Pleasanton, CA (US)

(72) Inventors: Bo Zheng, Saratoga, CA (US); Arvind Sundarrajan, San Jose, CA (US); Xinyu Fu, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/906,543

(22) Filed: May 31, 2013

(65) Prior Publication Data

US 2013/0316533 A1 Nov. 28, 2013

Related U.S. Application Data

(63) Continuation of application No. 13/480,091, filed on May 24, 2012, now Pat. No. 8,455,352.

(51) Int. Cl.
*H01L 21/44* (2006.01)

(52) U.S. Cl.
USPC ........... 438/663; 438/597; 438/637; 438/649; 438/655

(58) Field of Classification Search
None
See application file for complete search history.

(56) References Cited

U.S. PATENT DOCUMENTS 8,455,352 B1 * 6/2013 Zheng et al. .................. 438/663

* cited by examiner

*Primary Examiner* — Kyoung Lee
(74) *Attorney, Agent, or Firm* — Patterson & Sheridan, LLP (57) ABSTRACT

Native oxides and associated residue are removed from surfaces of a substrate by sequentially performing two plasma cleaning processes on the substrate in a single processing chamber. The first plasma cleaning process removes native oxide formed on a substrate surface by generating a cleaning plasma from a mixture of ammonia ($NH_3$) and nitrogen trifluoride ($NF_3$) gases, condensing products of the cleaning plasma on the native oxide to form a thin film that contains ammonium hexafluorosilicate (($NH_4)_2SiF_6$), and subliming the thin film off of the substrate surface. The second plasma cleaning process removes remaining residues of the thin film by generating a second cleaning plasma from nitrogen trifluoride gas. Products of the second cleaning plasma react with a few angstroms of the bare silicon present on the surface, forming silicon tetrafluoride ($SiF_4$) and lifting off residues of the thin film.

25 Claims, 7 Drawing Sheets

METHOD FOR REMOVING NATIVE OXIDE AND ASSOCIATED RESIDUE FROM A SUBSTRATE

CROSS-REFERENCE TO RELATED APPLICATIONS

This application is a continuation of U.S. patent application Ser. No. 13/480,091, filed May 24, 2012, each of which is herein incorporated by reference.

BACKGROUND OF THE INVENTION

1. Field of the Invention

Embodiments of the present invention relate generally to semiconductor substrate processing and, more particularly, to systems and methods for cleaning native oxide and associated residue from a substrate.

2. Description of the Related Art

In the microfabrication of integrated circuits and other devices, electrical interconnect features, such as contacts, vias, and lines, are commonly constructed on a substrate using high aspect ratio apertures formed in a dielectric material. The presence of native oxides and other contaminants such as etch residue within these small apertures is highly undesirable, contributing to void formation during subsequent metalization of the aperture and increasing the electrical resistance of the interconnect feature.

A native oxide typically forms when a substrate surface, such as a bare silicon surface, is exposed to oxygen and water. Oxygen exposure occurs when substrates are moved between processing chambers at atmospheric or ambient conditions, or when a small amount of oxygen remains in a processing chamber. In addition, native oxides may result from contamination during etching processes. Native oxide films are usually very thin, for example between 5-20 angstroms, but thick enough to cause difficulties in subsequent fabrication processes. Therefore, a native oxide layer is typically undesirable and needs to be removed prior to subsequent fabrication processes.

For example, a particular problem arises when native silicon oxide films are formed on exposed silicon containing layers, especially during processing of metal oxide silicon field effect transistor (MOSFET) structures. Silicon oxide films are electrically insulating and are undesirable at interfaces with contact electrodes or interconnecting electrical pathways because they cause high electrical contact resistance. In MOSFET structures, the electrodes and interconnecting pathways include silicide layers formed by depositing a refractory metal on bare silicon and annealing the metal to produce a metal silicide layer. Native silicon oxide films at the interface between the silicon substrate and the deposited metal reduce the compositional uniformity of the silicide layer by impeding the diffusional chemical reaction that forms the metal silicide during anneal. This results in lower substrate yields and increased failure rates due to overheating at the electrical contacts. The native silicon oxide film can also prevent adhesion of layers which are subsequently deposited on the substrate.

Various techniques are known for removing native oxides from a surface prior to metalization, but generally have one or more drawbacks. Sputter etch processes have been used to reduce contaminants, but are generally only effective in large features or in small features having aspect ratios less than about 4:1. In addition, sputter etch processes can damage delicate silicon layers by physical bombardment. Wet etch processes utilizing hydrofluoric acid are used to remove native oxides, but are less effective in smaller features with aspect ratios exceeding 4:1. This is because the aqueous solution has difficulty penetrating and being removed from vias, contacts, or other small features formed on the substrate surface, resulting in incomplete removal of the native oxide film and subsequent contamination issues. Also used to remove native oxides is a cleaning plasma that is generated from a mixture of ammonia and nitrogen trifluoride gases. When condensed on a substrate surface with a native silicon oxide, the products of the cleaning plasma form a thin film, containing ammonium hexafluorosilicate, from the native oxide. The film can be subsequently heated and sublimed off of the substrate. In high aspect ratio features, however, the thin film may not completely sublime, leaving an unwanted residue on the substrate. Furthermore, water generated in the formation of the thin film may produce additional native oxide on the substrate.

Accordingly, there is a need in the art for methods of removing native oxides and associated residue from a substrate that does not have the disadvantages outlined above.

SUMMARY OF THE INVENTION

One or more embodiments of the present invention provide methods for removing native oxides and associated residue by sequentially performing two plasma cleaning processes on a substrate in a single processing chamber. The first plasma cleaning process removes native oxide formed on a substrate surface by generating a cleaning plasma from a mixture of ammonia ($NH_3$) and nitrogen trifluoride ($NF_3$) gases, condensing products of the cleaning plasma on the native oxide to form a thin film that contains ammonium hexafluorosilicate (($NH_4)_2SiF_6$), and subliming the thin film off of the substrate surface. The second plasma cleaning process removes remaining residues of the thin film by generating a second cleaning plasma from nitrogen trifluoride gas. Products of the second cleaning plasma react with a few angstroms of the bare silicon present on the surface, forming silicon tetrafluoride ($SiF_4$) and lifting off residues of the thin film.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

Figure 1A:
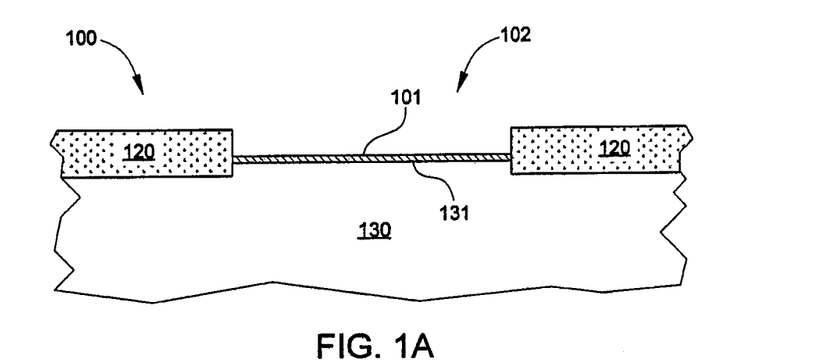
FIGS. 1A-1F are schematic cross-sectional views of a substrate surface treated according to embodiments of the invention.

FIGS. 1A-1F are schematic cross-sectional views of a substrate surface treated according to embodiments of the invention. Substrate 100 may be a 200 or 300 mm silicon wafer, or any other substrate used to fabricate microelectronic devices and the like. Substrate 100 includes a bulk region 130 that may be a silicon-containing underlayer or may be the actual underlying bulk portion of substrate 100. As shown in FIG. 1A, substrate 100 includes a nitride layer 120 with an opening 102 formed therein to expose a surface 131 of bulk region 130. Nitride layer 120 may comprise silicon nitride ($Si_3N_4$) and/or other durable masking materials, and is deposited on bulk region 130 to protect bulk region 130 during oxide deposition and other fabrication processes. A native oxide layer 101 is formed in opening 102 of nitride layer 120 due to the exposure of surface 131 of bulk region 130 to either atmosphere or to one or more fabrication processes that cause native oxide layer 101 to form, such as wet processes.

Figure 1B:
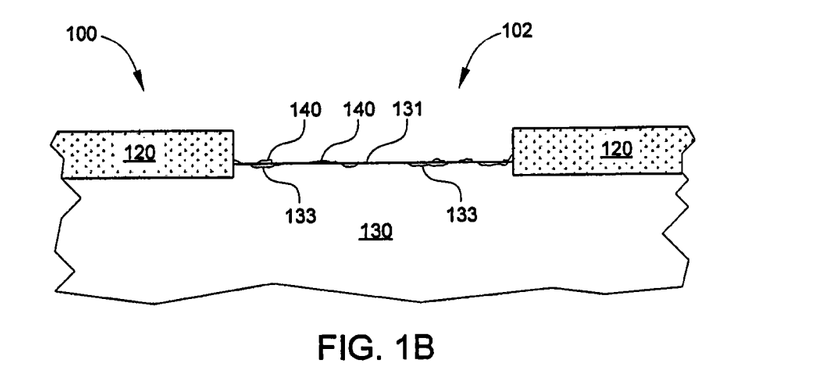

In FIG. 1B, substrate 100 is illustrated after undergoing a first plasma cleaning process, according to embodiments of the invention. One such embodiment is described below in conjunction with FIG. 4. As shown, native oxide layer 101 has been removed, leaving surface 131 of bulk region 130 exposed. However, residues 140 and regions 133 of native oxide may be scattered across surface 131. Residues 140 may be remainder portions of an ammonium hexafluorosilicate $((NH_4)_2SiF_6)$ containing film that were not completely sublimed from surface 131 during the first plasma cleaning process. Regions 133 may be very thin regions of native oxide, and may be formed on surface 131 after the first plasma cleaning process, since water vapor is produced as a byproduct of the first plasma cleaning process, or may be residual portions of native oxide layer 101 that were not completely removed.

Figure 1C:
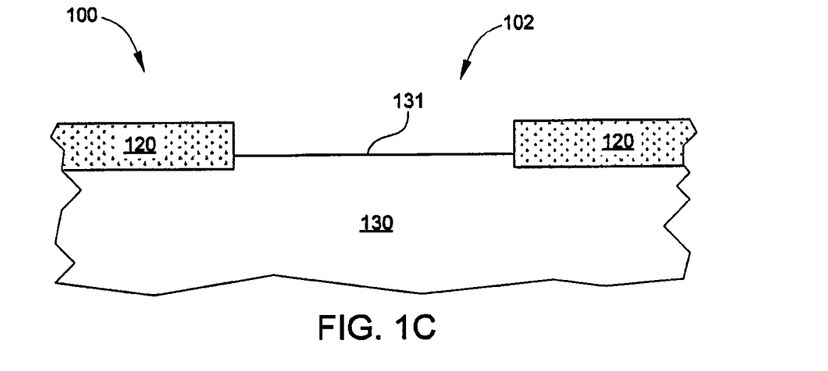

In FIG. 1C, substrate 100 is illustrated after undergoing a second plasma cleaning process, according to embodiments of the invention. One such embodiment is described below in conjunction with FIG. 4. As shown, residues 140 and regions 133 of native oxide have been removed. Because the second plasma cleaning process is performed in a vacuum chamber, surface 131 of bulk region 130 has no significant exposure to oxygen, and therefore remains free of native oxide.

Figure 1D:
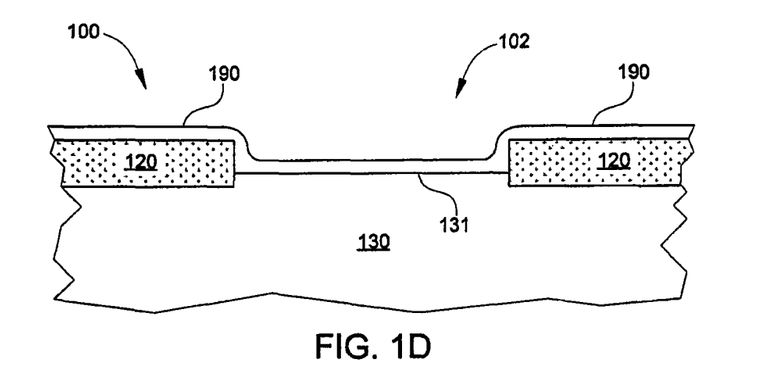

In FIG. 1D substrate 100 is illustrated after a metal layer 190 has been deposited on substrate 100. Metal layer 190 may be deposited by any technically feasible technique, including physical vapor deposition (PVD), chemical vapor deposition (CVD), atomic layer deposition (ALD), and the like. In one embodiment, metal layer 190 includes a CVD cobalt layer, to facilitate the formation of a silicide layer on surface 131. In other embodiments, metal layer 190 includes one or more of tungsten, titanium, and nickel. Because the first and second plasma cleaning processes can be performed in one chamber of a multi-chamber processing system and metal layer 190 can be deposited in another chamber of the same multi-chamber processing system, metal layer 190 can be deposited on substrate 100 without exposing substrate 100 to atmosphere. Consequently, surface 131 comprises an extremely clean surface free of native oxide and other residues, and a high quality silicide interface can be formed thereon.

Figure 1E:
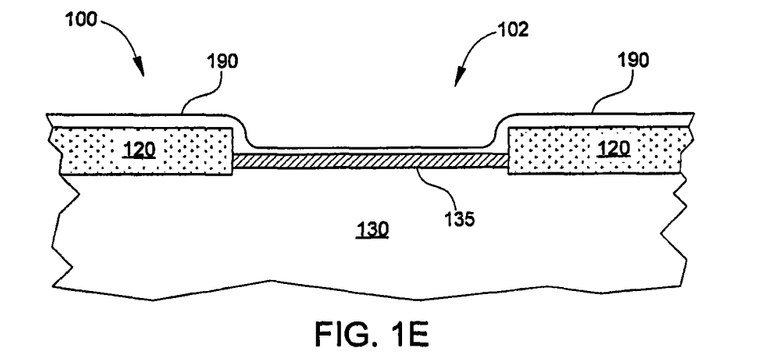

In FIG. 1E, substrate 100 is illustrated after a thermal anneal process has formed a silicide layer 135 from metal layer 190 and bulk region 130. In some embodiments, described below in conjunction with FIG. 6, the thermal anneal process forming silicide layer 135 is performed in a chamber of the multi-chamber processing system that is also used to perform the first and second plasma cleaning processes and the deposition of metal layer 190.

Figure 1F:
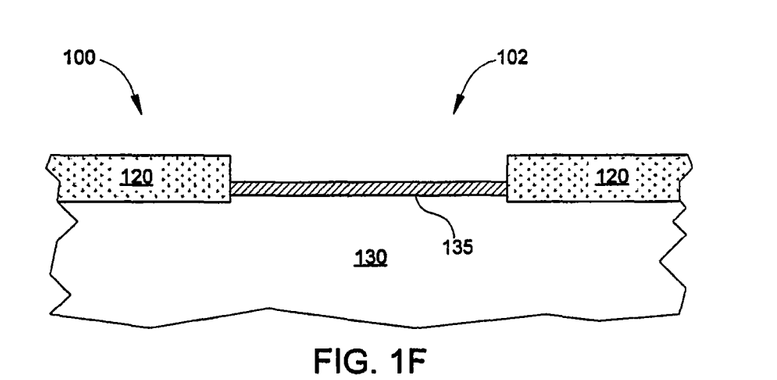

In FIG. 1F, substrate 100 is illustrated after metal layer 190 has been removed from substrate 100, leaving metal silicide layer 135 exposed in opening 102.

Figure 2:
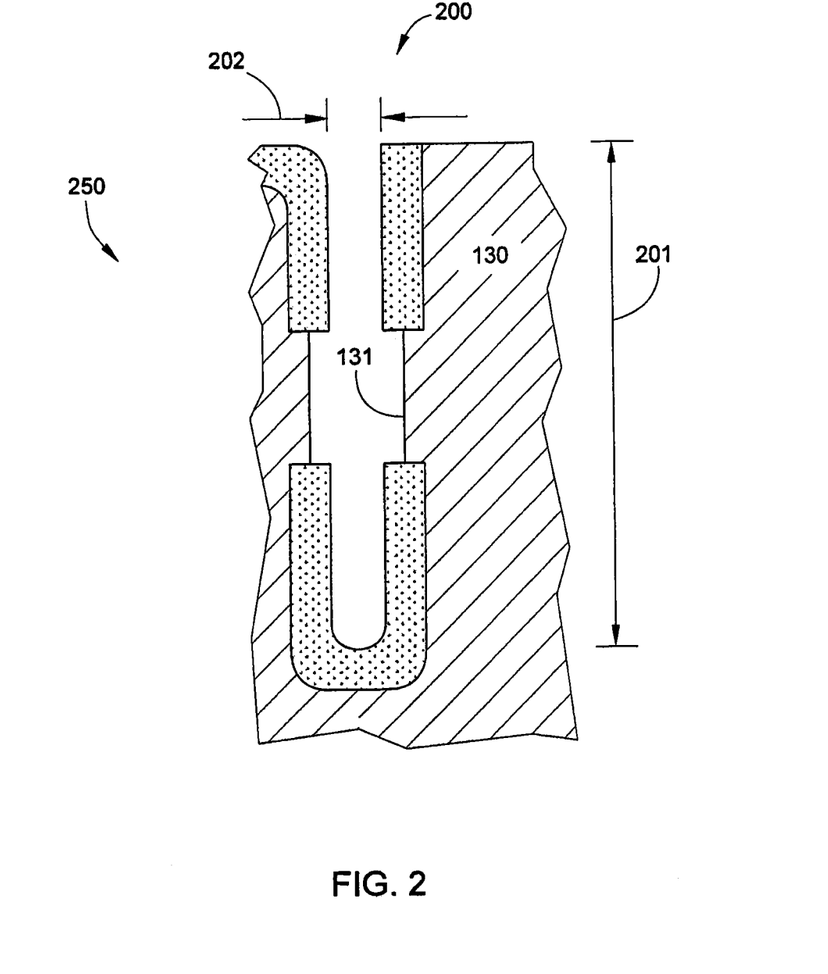
FIG. 2 is a schematic cross-sectional view of a high-aspect feature formed on a substrate that includes the substrate surface illustrated in FIG. 1F.

In some embodiments, opening 102, surface 131, and nitride layer 120 may be disposed on a sidewall of a high aspect ratio feature formed on substrate 100. For example, surface 131 may be configured as an element of a vertical contact formed adjacent a very high aspect ratio trench, via, or other aperture. One such embodiment is illustrated in FIG. 2. FIG. 2 is a schematic cross-sectional view of a high aspect ratio feature 200 formed on a substrate that includes the substrate surface illustrated in FIG. 1F. High aspect ratio feature 200 may be a trench, via, or other aperture formed on a surface of a substrate 250 as part of the fabrication process of a microelectronic device. For example, high aspect ratio feature 200 may comprise a portion of a vertical contact. The ratio of depth 201 to width 202 of high aspect ratio feature 200 may be greater than 10:1 or, in some embodiments, greater than 100:1. Consequently, complete sublimation of an ammonium hexafluorosilicate thin film during a plasma cleaning process is unreliable, leaving unwanted residue that can deleteriously affect the quality of subsequently deposited metal layers. According to one or more embodiments of the invention, a two-step plasma cleaning process addresses this issue.

Figure 3:
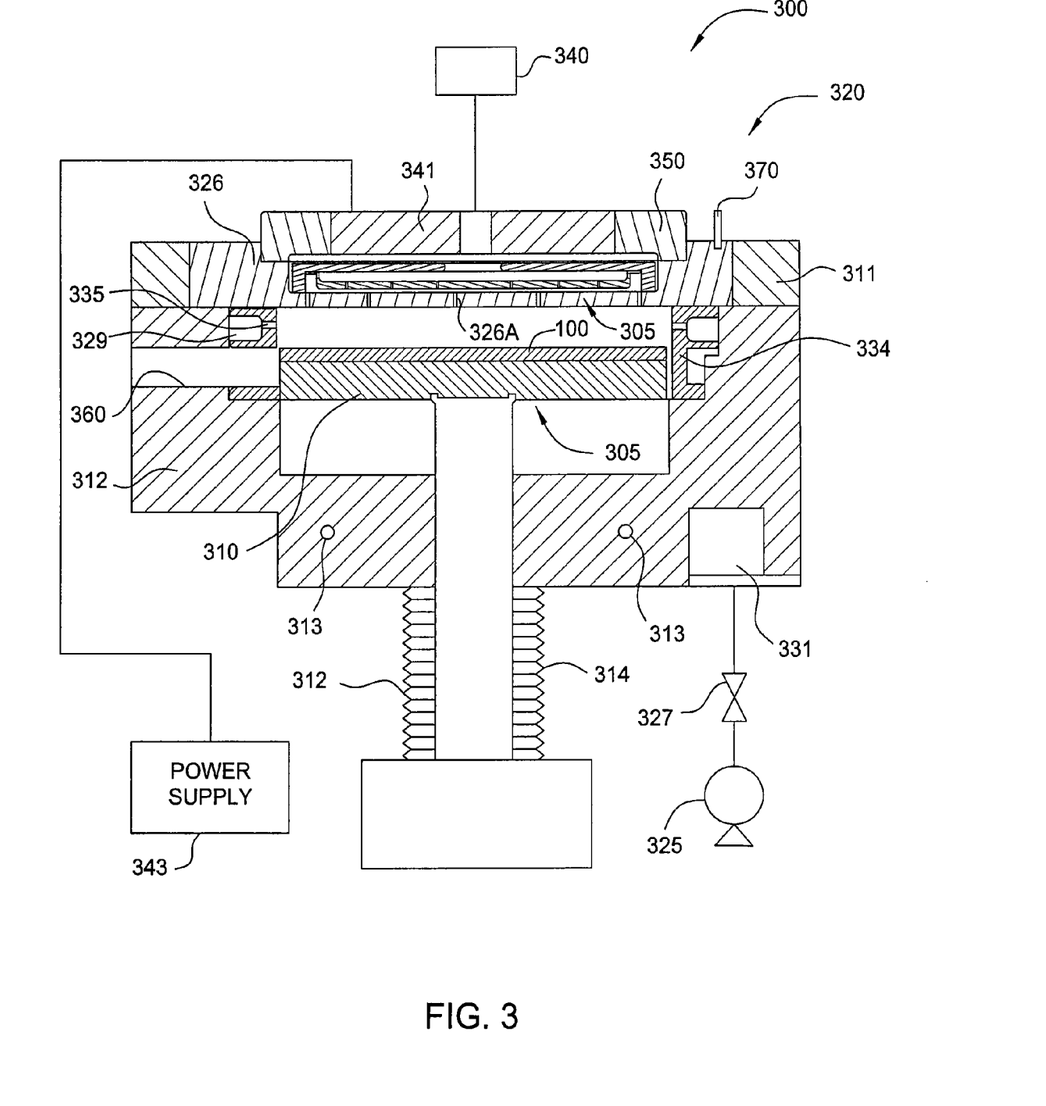
FIG. 3 is a schematic cross-sectional view of a processing chamber configured to perform a two-step plasma cleaning process according to one or more embodiments of the invention.

FIG. 3 is a schematic cross-sectional view of a processing chamber 300 configured to perform a two-step plasma cleaning process according to one or more embodiments of the invention. Processing chamber 300 includes a lid assembly 320 disposed at an upper end of a chamber body 312, and a support assembly 315 at least partially disposed within chamber body 312. Processing chamber 300 also includes a remote plasma generator 340. Exemplary remote plasma generators are available from vendors such as MKS Instruments, Inc., and Advanced Energy Industries, Inc. Processing chamber 300 and the associated hardware are preferably formed from one or more process-compatible materials, for example, aluminum, anodized aluminum, nickel plated aluminum, nickel plated aluminum 6061-T6, stainless steel, as well as combinations and alloys thereof.

Support assembly 315 is disposed within chamber body 312. Support assembly 315 is raised and lowered by a shaft 314, which is enclosed by a bellows 333, and includes a substrate support member 310. Chamber body 312 includes a slit valve opening 360 formed in a sidewall thereof to provide access to the interior of processing chamber 300. In one embodiment, a substrate 100 may be transported in and out of processing chamber 300 through slit valve opening 360 to an adjacent transfer chamber and/or load-lock chamber (not shown), or another chamber within a cluster tool. Exemplary cluster tools include but are not limited to the PRODUCER®, CENTURA®, ENDURA®, and ENDURA® SL platforms, available from Applied Materials, Inc., located in Santa Clara, Calif.

Chamber body 312 also includes channels 313 formed therein for flowing a heat transfer fluid therethrough. The heat transfer fluid may be a heating fluid or a coolant and is used to control the temperature of chamber body 312 during processing and substrate transfer. The temperature of chamber body 312 is important to prevent unwanted condensation of process gas or byproducts on the chamber walls. Exemplary heat transfer fluids include water, ethylene glycol, or a mixture thereof.

Chamber body 312 further includes a liner 334 that surrounds support assembly 315 and is removable for servicing and cleaning. Liner 334 may be made of a metal such as aluminum, a ceramic material, or any other material or materials that are compatible for use during the process of substrates in processing chamber 300. Liner 334 typically includes one or more apertures 335 and a pumping channel 329 formed therein that is in fluid communication with a vacuum system. Apertures 335 provide a flow path for gases into pumping channel 329, and the pumping channel provides a flow path through liner 334 so the gases can exit processing chamber 300.

Processing chamber 300 further includes a vacuum pump 325 and a throttle valve 327 to regulate flow of gases within processing chamber 300. Vacuum pump 325 is coupled to a vacuum port 331 disposed on chamber body 312, and is in fluid communication with pumping channel 329 formed within liner 334. Vacuum pump 325 and chamber body 312 are selectively isolated by throttle valve 327 to regulate flow of the gases within processing chamber 300.

Lid assembly 320 contains a number of components stacked together. For example, lid assembly 320 contains a lid rim 311, gas delivery assembly 305, and top plate 350. Lid rim 311 is designed to hold the weight of the components making up lid assembly 320 and is coupled to an upper surface of chamber body 312 to provide access to the internal chamber components. Gas delivery assembly 305 is coupled to an upper surface of lid rim 311 and is arranged to make minimum thermal contact therewith. The components of lid assembly 320 are preferably constructed of a material having a high thermal conductivity and low thermal resistance, such as an aluminum alloy with a highly finished surface, for example. Preferably, the thermal resistance of the components is less than about $5 \times 10^{-4}$ m$^2$ K/W.

Gas delivery assembly 305 may comprise a gas distribution plate 326 or showerhead. A gas supply panel (not shown) is typically used to provide the one or more gases to processing chamber 300. The particular gas or gases that are used depend upon the processes to be performed within processing chamber 300. To facilitate the plasma cleaning processes as described herein, such process gases include ammonia, nitrogen trifluoride, and one or more carrier and purge gases, and other suitable gases. Typically, the process gases are introduced to processing chamber 300 into lid assembly 320 and then into chamber body 312 through gas delivery assembly 305.

In some embodiments, instead of using remote plasma generator 340, lid assembly 320 may include an electrode 341 to generate a plasma of reactive species within lid assembly 320, instead of receiving. In such an embodiment, electrode 341 is supported on top plate 350 and is electrically isolated therefrom, for example with an isolator ring (not shown). Also in such an embodiment, electrode 341 is coupled to a power supply 343 and gas delivery assembly 305 is connected to ground. Accordingly, a plasma of the one or more process gases can be struck in the volume formed between electrode 341 and gas delivery assembly 305. Thus, the plasma is well confined or contained within lid assembly 320.

Any power source may be used in processing chamber 300 that is capable of activating the gases into reactive species and maintaining the plasma of reactive species, whether remote plasma generator 340 or electrode 341 is used to generate a desired plasma. For example, radio frequency (RF), direct current (DC), alternating current (AC), or microwave (MW) based power discharge techniques may be used. Plasma activation may also be generated by a thermally based technique, a gas breakdown technique, a high intensity light source (e.g., UV energy), or exposure to an x-ray source.

Gas delivery assembly 305 may be heated depending on the process gases and operations to be performed within processing chamber 300. In one embodiment, a heating element 370, such as a resistive heater, is coupled to gas delivery assembly 305 and regulates the temperature of gas delivery assembly 305. In the embodiment illustrated in FIG. 3, the bottom surface of gas delivery assembly 305 is substantially parallel to the top surface of substrate support member 310. In other embodiments, the bottom surface of gas delivery assembly 305 may be dome-shaped or otherwise configured in order to optimize gas flow and heating of a substrate in processing chamber 300.

Processing chamber 300 is particularly useful for performing plasma cleaning processes as described herein, since heating and cooling of the substrate surface without breaking vacuum is required.

Figure 4:
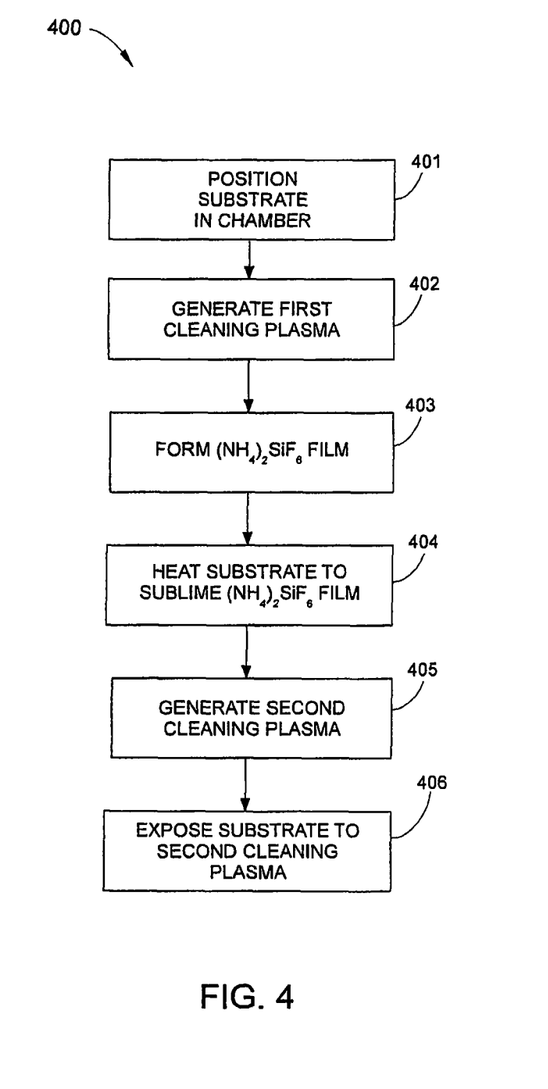
FIG. 4 is a flowchart of method steps for processing a substrate in a processing chamber, according to one or more embodiments of the present invention.

FIG. 4 is a flowchart of method steps for processing a substrate in a processing chamber, according to one or more embodiments of the present invention. Method 400 includes a two-step plasma cleaning process for removing native oxides and residues associated with the oxide removal process, i.e., ammonium hexafluorosilicate. Although the method steps are described in conjunction with processing chamber 300 in FIG. 3, it is understood that any processing chamber configured to perform the method steps falls within the scope of the invention.

As shown, method 400 begins at step 401, in which a substrate, such as substrate 100 illustrated in FIG. 1A, is positioned on substrate support member 310 and controlled to a desired temperature. Substrate 100 includes native oxide layer 101 disposed in opening 102 of nitride layer 120, and is placed into chamber body 312 through slit valve opening 360 and is disposed on the upper surface of support member 310. Support member 310 then lifts substrate 100 to a processing position within chamber body 312 and cools substrate 100 to a temperature of below about 50° C. or less by passing a coolant through fluid channels therein. In some embodiments, substrate 100 is cooled to a higher temperature than 50° C. in step 401, but no greater than 70° C. This is because a substrate temperature of 75° C. or higher during step 403 (described below) may result in the unwanted sublimation of solid byproducts. Chamber body 312 is preferably heated to a temperature within a range from about 50° C. to about 80° C. by passing a heat transfer medium through the channels 313.

In step 402, a first cleaning plasma is generated, either remotely by remote plasma generator 340 or by power supply 343 coupled to electrode 341. First, an etching gas mixture is introduced into remote plasma generator 340 or into processing chamber 300, where the gas mixture comprises nitrogen trifluoride (NF$_3$) and ammonia (NH$_3$) and has an NH$_3$/NF$_3$ molar ratio of about 5 or greater. The amount of each gas introduced is variable and may be adjusted to accommodate, for example, the thickness of native oxide layer 101 to be removed, the geometry of substrate 100 and features thereon to be cleaned, the volume capacity of the plasma, and the volume capacity of chamber body 312. Next, plasma is generated, and plasma energy dissociates the ammonia and nitrogen trifluoride gases into reactive species that combine to form reactive gases, such as ammonium fluoride ($NH_4F$) and/or ammonium hydrogen fluoride ($NH_4F \cdot HF$). The reactive gases flows through gas delivery assembly 305 via holes 326A of gas distribution plate 326 to react with the native oxide layer 101 on substrate 100. In some embodiments, the gas mixture includes one or more carrier gases, which may be introduced prior to striking plasma.

In step 403, products of the first cleaning plasma condense onto substrate 100 to form a thin film. Specifically, the thin film includes ammonium hexafluorosilicate (($NH_4)_2SiF_6$), which is formed in part from silicon oxide ($SiO_x$) in native oxide layer 101. In addition, gaseous water are produced and are removed from processing chamber 300 by vacuum pump 325. It is noted that the temperature of substrate 100 is maintained at a temperature of 70° C. or below during step 403, and in some embodiments 50° C. or less, to prevent sublimation of the thin film. For example, in one embodiment, the temperature of support member 310 is controlled to a temperature of about 35-40° C. so that the temperature of substrate 100 is maintained below about 50° C. or below during step 403. It is further noted that the process taking place in step 403 has a high selectivity of etching silicon oxide to silicon nitride, e.g., a selectivity of about 9. Consequently, native oxide layer 101 can be removed while largely preserving nitride layer 120.

In step 404, substrate 100 is heated within processing chamber 300 to an elevated temperature to remove the thin film of ammonium hexafluorosilicate from surface 131 of substrate 100. To that end, support member 310 is elevated to an anneal position in close proximity to heated gas distribution plate 326. Heat radiated from gas distribution plate 326 may sublime the thin film of ammonium hexafluorosilicate into volatile compounds, such as silicon tetrafluoride, ammonia, and hydrogen fluoride. These volatile products are then removed from processing chamber 300 by vacuum pump 325. The thin film may be sublimed and removed from substrate 100 when substrate 100 is heated to a temperature of about 100° C. or greater. After the sublimation of the ammonium hexafluorosilicate thin film formed in step 403, virtually all of native oxide layer 101 is removed, as illustrated in FIG. 1B. However, depending on the geometry and aspect ratio of the features on which native oxide layer 101 is formed, some residue 140 of the ammonium hexafluorosilicate thin film may still be present on surface 131 of substrate 100. In addition, due to the production of water vapor in step 403, small regions 133 of native oxide may also still be present on surface 131.

In step 405, a second cleaning plasma is generated, either remotely by remote plasma generator 340 or by power supply 343 coupled to electrode 341. The second cleaning plasma generated in step 405 differs from the first cleaning plasma generated in step 403 in a number of ways. (1) The gas mixture used includes nitrogen trifluoride but does not include ammonia. (2) The flow rate of the nitrogen trifluoride in step 405 is significantly greater than in step 403. For example, in an embodiment in which processing chamber 300 is configured for a 300 mm diameter silicon wafer, in step 403 the flow rate of nitrogen trifluoride is generally less than or equal to about 50 sccm. In contrast, in step 405 the flow rate of nitrogen trifluoride is equal to or greater than about 100 sccm, and in some embodiments as high as 500 sccm. It is believed that the high nitrogen trifluoride flow rate provides superior selectivity of silicon-containing materials, such as polysilicon, over silicon nitride. Consequently, performing the plasma cleaning process of step 405 in addition to the plasma cleaning process of step 403 does not substantially erode nitride layer 120, which is highly desirable. This is because nitride layer 120 is a protection layer used to prevent silicide formation in unwanted regions of substrate 100. (3) The plasma-generating power used in step 405 is significantly higher than the plasma-generating power used in step 403. For example, in the embodiment in which processing chamber 300 is configured for a 300 mm diameter silicon wafer, in step 403 the plasma-generating power is generally less than or equal to about 30 to 50 W. In contrast, in step 405 the plasma-generating power is equal to or greater than about 350 W, and in some embodiments as high as 500 W. The minimum 350 W is desirable to enable etching of silicon from surface 131. (4) The frequency of RF power used to generate the plasma in step 403 (less than or equal to 100 kHz), is significantly lower than the frequency of RF power used in step 405 (equal to or greater than 350 kHz). (5) The temperature of substrate 100 is maintained above 100° C. in the second plasma clean step of step 405, which helps to remove reaction by-products.

In step 406, substrate 100 is exposed to the second cleaning plasma generated in step 405. It is noted that the second plasma cleaning process performed in step 405 removes a very small amount of silicon, for example 10 Å or less, and therefore preserves most of bulk region 130 of substrate 100. However, the removal of this small quantity of silicon from surface 131 also removes the small regions 133 of native oxide and lifts off residue 140. In this way, an oxide-free and residue-free surface 131 is formed on substrate 100. It is noted that substrate 100 may be a vertical side contact in a very narrow feature, for example as narrow as 20 nm or less, so that residue is difficult to remove. However, the second plasma cleaning process described in steps 405 and 406 can remove such resides. It is further noted that said second plasma cleaning process provides good selectivity of silicon to silicon nitride and silicon oxide, thereby preserving nitride layer 120 and other features formed on substrate 100 while etching surface 131. Generally, the second plasma cleaning process described herein has an etch rate of essentially zero for silicon nitride and silicon oxide, and a small but finite etch rate for silicon, e.g., 2 to 4 Å/sec.

Figure 5:
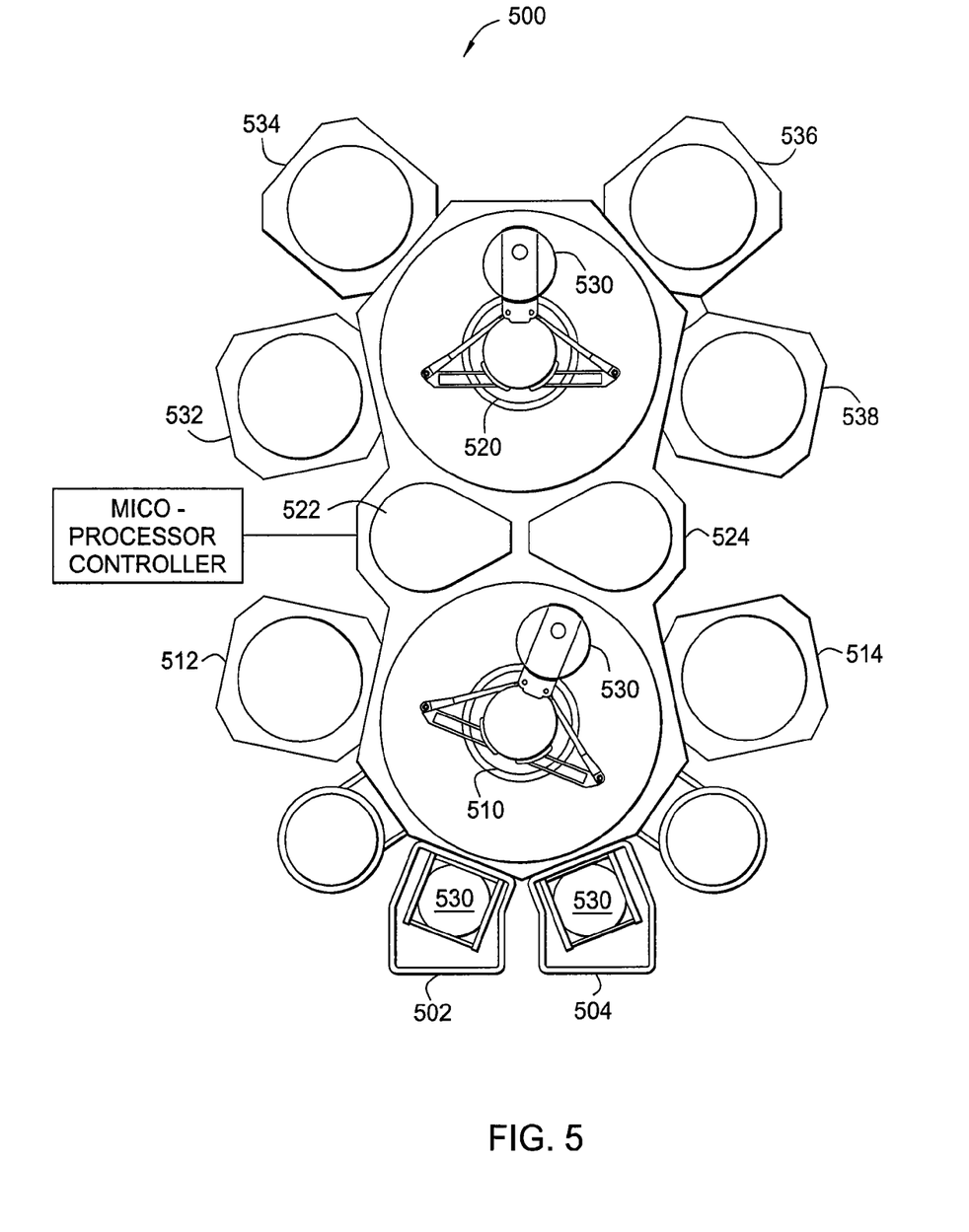
FIG. 5 is a schematic plan view diagram of an exemplary multi-chamber processing system configured to perform a high-frequency, hydrogen-based plasma process on a substrate, according to one or more embodiments of the invention.

FIG. 5 is a schematic plan view diagram of an exemplary multi-chamber processing system 500 configured to perform a two-step plasma cleaning process on substrates 530, according to one or more embodiments of the invention. Multi-chamber processing system 500 includes one or more load lock chambers 502, 504 for transferring substrates 530 into and out of the vacuum portion of multi-chamber processing system 500. Consequently, load lock chambers 502, 504 can be pumped down to introduce substrates into multi-chamber processing system 500 for processing under vacuum. A first robot 510 transfers substrates 530 between load lock chambers 502 and 504, transfer chambers 522 and 524, and a first set of one or more processing chambers 512 and 514. A second robot 520 transfers substrates 530 between transfer chambers 522 and 524 and processing chambers 532, 534, 536, 538.

One or both of processing chambers 512 and 514 may be configured to perform a two-step plasma cleaning process, according to embodiments of the invention described herein, when substrates 530 include native oxide layer 101 as described with reference to substrate 100. The transfer chambers 522, 524 can be used to maintain ultrahigh vacuum conditions while substrates are transferred within multi-chamber processing system 500. Processing chambers 532, 534, 536, 538 are configured to perform various substrate-processing operations including cyclical layer deposition (CLD), atomic layer deposition (ALD), chemical vapor deposition (CVD), physical vapor deposition (PVD), and the like. In one embodiment, one or more of processing chambers 532,

534, 536, 538 are configured to deposit a cobalt stack comprising a plurality of plasma-treated cobalt layers. Processing chambers suitable for depositing cobalt layers are conventionally known.

Figure 6:
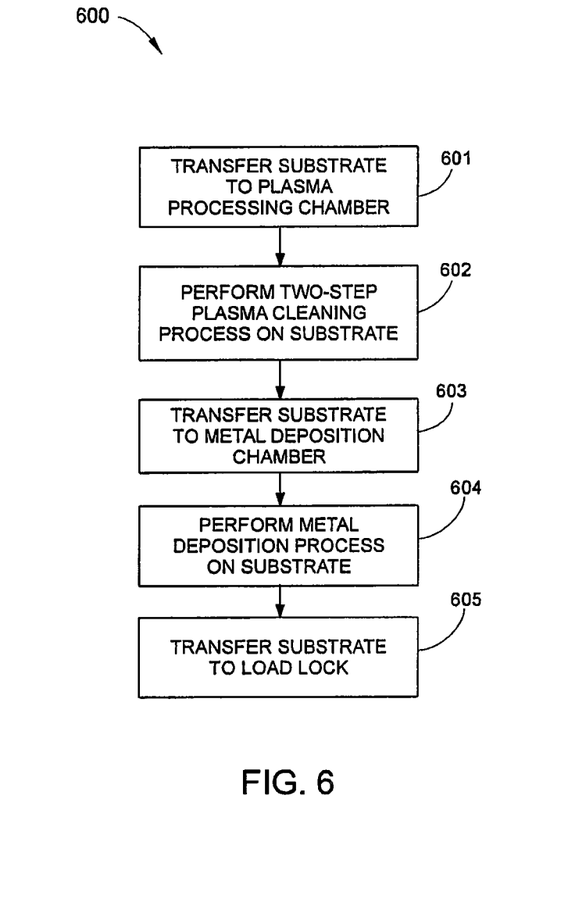
FIG. 6 is a flowchart of method steps for processing a substrate in a multi-chamber processing system, according to one or more embodiments of the present invention.

FIG. 6 is a flowchart of method steps for processing a substrate in a multi-chamber processing system, according to one or more embodiments of the present invention. Method 600 enables the removal of native oxide layers and other contaminants from one or more apertures formed on a substrate. Furthermore, method 600 enables the deposition of barrier layers, seed layers, and/or other metalization layers in said apertures immediately after the removal of the metal oxide layer and prior to any exposure of the apertures to atmospheric conditions. Consequently, the one or more metal deposition processes are performed on oxide-free metal surfaces. Although the method steps are described in conjunction with multi-chamber processing system 600 in FIG. 6, is understand that any multi-chamber processing system 600 configured to perform the method steps is within the scope of the invention.

As shown, method 600 begins at step 601, in which a substrate 530 is transferred from one of load lock chambers 502, 504 to one of processing chambers 512 and 514.

In step 602, substrate 530 undergoes the two-step plasma cleaning process as described above in conjunction with FIG. 3 and illustrated with reference to FIGS. 1A-1F and FIG. 2. The two-step plasma cleaning process removes native oxide layers and contamination from apertures formed on substrate 530.

In step 603, substrate 530 is transferred by first robot 510 and second robot 520 to one or more of processing chambers 532, 534, 536, or 538.

In step 604, substrate 530 undergoes one or more metal deposition processes, such as a barrier layer deposition, a seed layer deposition, etc. Because substrate 530 has not been exposed to atmosphere since the two-step plasma cleaning process of step 602, the metal deposition processes of step 604 are performed on extremely clean surfaces.

In some embodiments, a CVD cobalt deposition process is performed on substrate 530 in step 604. In one such embodiment, a cobalt stack comprising a plurality of plasma-treated cobalt layers is formed on the clean and oxide-free surfaces produced on substrate 530 in step 602. For example, each of the cobalt layers may be deposited from a deposition gas containing a cobalt source gas and hydrogen gas during a thermal CVD process. The substrate may be heated to a temperature between about 50° C. and about 400° C. during the thermal CVD process.

In one example embodiment, the cobalt source gas includes dicobalt hexacarbonyl butylacetylene (CCTBA). Each of the cobalt layers formed may be exposed to the plasma to form plasma-treated cobalt layers during a plasma treatment process. The plasma is generally a reducing plasma and may contain or be formed of a reagent, such as ammonia ($NH_3$), hydrogen ($H_2$), hydrazine ($N_2H_4$), diazene ($N_2H_2$), an ammonia/hydrogen mixture, derivatives thereof, or combinations thereof. In some examples, each cobalt layer may be exposed to the hydrogen plasma for a time period within a range from about 10 seconds to about 180 seconds during the plasma treatment process after each cycle of the thermal CVD deposition process. In some embodiments, a thermal anneal process is performed on substrate 530 after the deposition of the stack of plasma-treated cobalt layers. In this way, a cobalt silicide may be advantageously formed on surfaces of substrate 530 in a single multi-chamber processing system.

In step 605, substrate 530 is transferred back to one of load lock chambers 502 or 504.

In summation, one or more embodiments of the present invention provide methods for removing native oxides and associated residue by sequentially performing two plasma cleaning processes on a substrate in a single processing chamber. Advantages of such embodiments include the formation of extremely clean, oxide-free surfaces, even when such surfaces are disposed on high aspect ratio features. In addition, very little silicon is removed in forming the clean surfaces, and, due to the high selectivity of the plasma cleaning processes over silicon nitride, very little silicon nitride is removed as well. Furthermore, the above-described cleaning process and the formation of a high quality metal silicide can be advantageously performed on a single multi-chamber processing system.

While the foregoing is directed to embodiments of the present invention, other and further embodiments of the invention may be devised without departing from the basic scope thereof, and the scope thereof is determined by the claims that follow.

We claim:

1. A method of processing a substrate disposed in a processing chamber, the method comprising:
   maintaining a substrate positioned in the processing chamber at a first temperature that prevents unwanted sublimation of solid byproducts;
   generating a first cleaning plasma from a first gas mixture with a first plasma-generating power, the first gas mixture comprising nitrogen trifluoride ($NF_3$) and ammonia ($NH_3$);
   condensing products of the first cleaning plasma onto the substrate to form a thin film during a plasma clean process while controlling the first temperature of the substrate, wherein the thin film comprises ammonium hexafluorosilicate (($NH_4)_2SiF_6$) formed in part from a silicon oxide ($SiO_x$) layer disposed on a surface of the substrate;
   heating the substrate within the processing chamber to a second temperature greater than the first temperature to remove the thin film from the surface;
   generating a second cleaning plasma from a second gas mixture with a second plasma-generating power, the second RF plasma-generating power being greater than the first plasma-generating power and the second gas mixture comprising nitrogen trifluoride; and
   exposing the surface to products of the second cleaning plasma while maintaining the substrate at the second temperature.

2. The method of claim 1, wherein the surface is disposed on a sidewall of a high aspect ratio aperture formed on the substrate.

3. The method of claim 2, wherein the ratio of the length of the sidewall to the width of the aperture is greater than about 10.

4. The method of claim 2, wherein the surface comprises a vertical contact.

5. The method of claim 1, wherein maintaining the substrate at a first temperature comprises cooling the substrate to about 70° C. or less.

6. The method of claim 1, wherein heating the substrate comprises positioning the substrate proximate a heated surface in the processing chamber and heating the substrate to a temperature of about 100° C. or greater.

7. The method of claim 1, wherein the first gas mixture is formed by introducing nitrogen trifluoride into the processing chamber at a first flow rate and the second gas mixture is formed by introducing nitrogen trifluoride into the processing chamber at a second flow rate, the second flow rate being greater than the first flow rate.

8. The method of claim 7, wherein the first gas mixture has an $NH_3/NF_3$ molar ratio of about 5 or greater.

9. The method of claim 1, wherein the substrate comprises a 300 mm diameter substrate, the first plasma-generating power is less than or equal to about 50 W, and the second plasma-generating power is greater than or equal to about 350 W.

10. The method of claim 1, wherein the first plasma-generating power and the second plasma-generating power comprise radio-frequency (RF) power and wherein the frequency of the first plasma-generating power is equal to or less than about 100 kHz and the frequency of the second plasma-generating power is equal to or greater than about 350 kHz.

11. The method of claim 1, wherein generating the first cleaning plasma comprises generating the first cleaning plasma in a plasma chamber remote from the processing chamber and generating the second cleaning plasma comprises generating the second cleaning plasma in the plasma chamber.

12. A method of processing a substrate disposed in a processing chamber, the method comprising:
adjusting a substrate positioned in the processing chamber at a first temperature that prevents unwanted sublimation of solid byproducts;
introducing a first gas mixture comprising nitrogen trifluoride ($NF_3$) and ammonia ($NH_3$) into a plasma chamber by flowing nitrogen trifluoride into the plasma chamber at a first flow rate and ammonia into the chamber at a second flow rate;
generating a first cleaning plasma in the plasma chamber;
condensing products of the first cleaning plasma onto the substrate while maintaining the substrate at the first temperature, thereby forming a thin film during a plasma clean process, wherein the thin film comprises ammonium hexafluorosilicate (($NH_4)_2SiF_6$) formed in part from a silicon oxide ($SiO_x$) layer disposed on a surface of the substrate;
heating the substrate to a second temperature greater than the first temperature within the processing chamber to remove the thin film from the substrate; and
introducing a second gas mixture comprising nitrogen trifluoride into the plasma chamber by flowing nitrogen trifluoride into the plasma chamber at a third flow rate that is greater than the first flow rate;
generating a second cleaning plasma from a second gas mixture using a second RF power, the second RF power being greater than the first RF power; and
exposing the surface to products of the second cleaning plasma while maintaining the substrate at the second temperature.

13. The method of claim 12, wherein generating the first cleaning plasma comprises using a first plasma-generating power and generating the second cleaning plasma comprises using a second plasma-generating power, the second plasma-generating power being greater than the first plasma-generating power.

14. The method of claim 12, wherein the first plasma-generating power and the second plasma-generating power comprise radio-frequency (RF) power and wherein the frequency of the first plasma-generating power is equal to or less than about 100 kHz and the frequency of the second plasma-generating power is equal to or greater than about 350 kHz.

15. The method of claim 12, wherein adjusting the first temperature of the substrate comprises cooling the substrate to about 70° C. or less.

16. The method of claim 12, wherein heating the substrate comprises positioning the substrate proximate a heated surface in the processing chamber and heating the substrate to a temperature of about 100° C. or greater.

17. The method of claim 12, wherein the first flow rate and second flow rate are selected so that the first gas mixture has an $NH_3/NF_3$ ratio of about 10 or greater.

18. A method of processing a substrate in a multi-chamber processing system, the method comprising the steps of:
controlling a substrate positioned in a first chamber of the multi-chamber processing system to a first temperature that prevents unwanted sublimation of solid byproducts;
generating a first cleaning plasma from a first gas mixture with a first plasma-generating power, the first gas mixture comprising nitrogen trifluoride ($NF_3$) and ammonia ($NH_3$);
condensing products of the first cleaning plasma onto the substrate to form a thin film during a plasma clean process while controlling the temperature of the substrate at the first temperature, wherein the thin film comprises ammonium hexafluorosilicate (($NH_4)_2SiF_6$) formed in part from a silicon oxide ($SiO_x$) layer disposed on a surface of the substrate;
heating the substrate within the first processing chamber to a second temperature greater than the first temperature to remove the thin film from the surface;
generating a second cleaning plasma from a second gas mixture with a second plasma-generating power, the second RF plasma-generating power being greater than the first plasma-generating power and the second gas mixture comprising nitrogen trifluoride;
exposing the surface to products of the second cleaning plasma while the substrate is positioned in the first processing chamber and maintained at the second temperature;
after the step of exposing the surface to products of the second cleaning plasma, transferring the substrate under vacuum from the first chamber to a second chamber of the multi-chamber processing system; and
after the step of transferring the substrate, depositing a metal film on the surface.

19. The method of claim 18, wherein depositing the metal film comprises performing chemical vapor deposition process.

20. The method of claim 19, wherein the metal film comprises a cobalt (Co) containing metal.

21. The method of claim 18, further comprising, without removing the substrate from the multi-chamber processing system, thermally annealing the metal film.

22. The method of claim 18, wherein depositing the metal film comprises:
depositing a cobalt layer during a deposition process;
exposing the cobalt layer to a plasma to form a plasma-treated cobalt layer during a plasma process; and
repeating the deposition process and the plasma process to form a cobalt stack comprising a plurality of plasma-treated cobalt layers.

23. The method of claim 18, wherein the temperature of the substrate is cooled to about 70° C. or less.

24. The method of claim 18, wherein the temperature of the substrate is heated to about 100° C. or greater.

25. The method of claim 18, wherein the first gas mixture has an $NH_3/NF_3$ molar ratio of about 5 or greater.

* * * * *

UNITED STATES PATENT AND TRADEMARK OFFICE
CERTIFICATE OF CORRECTION

| | | |
|---|---|---|
| PATENT NO. | : 8,772,162 B2 | Page 1 of 1 |
| APPLICATION NO. | : 13/906543 | |
| DATED | : July 8, 2014 | |
| INVENTOR(S) | : Zheng et al. | |

It is certified that error appears in the above-identified patent and that said Letters Patent is hereby corrected as shown below:

In the Drawings:

Sheet 6 of 7, please delete "Mico-Processor Controller" and insert --Micro-Processor Controller-- therefor.

Signed and Sealed this
Twenty-first Day of October, 2014

Michelle K. Lee
*Deputy Director of the United States Patent and Trademark Office*